(12) United States Patent
Uzoh et al.

(10) Patent No.: US 9,741,620 B2
(45) Date of Patent: Aug. 22, 2017

(54) STRUCTURES AND METHODS FOR RELIABLE PACKAGES

(71) Applicant: Invensas Corporation, San Jose, CA (US)

(72) Inventors: Cyprian Emeka Uzoh, San Jose, CA (US); Guilian Gao, San Jose, CA (US); Liang Wang, Milpitas, CA (US); Hong Shen, Palo Alto, CA (US); Arkalgud R. Sitaram, Cupertino, CA (US)

(73) Assignee: INVENSAS CORPORATION, San Jose, CA (US)

( * ) Notice: Subject to any disclaimer, the term of this patent is extended or adjusted under 35 U.S.C. 154(b) by 3 days.

(21) Appl. No.: 14/749,529

(22) Filed: Jun. 24, 2015

(65) Prior Publication Data

US 2016/0379885 A1     Dec. 29, 2016

(51) Int. Cl.

| H01L 21/00 | (2006.01) |
|---|---|
| H01L 21/70 | (2006.01) |
| *H01L 21/82* | (2006.01) |
| *H01L 21/56* | (2006.01) |
| *H01L 23/00* | (2006.01) |
| *H01L 21/48* | (2006.01) |

(Continued)

(52) U.S. Cl.
CPC ............ *H01L 21/82* (2013.01); *H01L 21/486* (2013.01); *H01L 21/561* (2013.01); *H01L 23/5389* (2013.01); *H01L 23/562* (2013.01); *H01L 24/96* (2013.01); *H01L 24/97* (2013.01); *H01L 24/98* (2013.01); *H01L 23/3128* (2013.01); *H01L 2924/157* (2013.01); *H01L 2924/15311* (2013.01); *H01L 2924/15313* (2013.01); *H01L 2924/15788* (2013.01); *H01L 2924/3511* (2013.01); *H01L 2924/3512* (2013.01)

(58) Field of Classification Search
CPC ......... H01L 21/82; H01L 21/56; H01L 23/31; H01L 23/52; H01L 24/96; H01L 24/98
USPC ......... 257/506, 686, E23.031; 438/207, 218, 438/219, 94, 427
See application file for complete search history.

(56) References Cited

U.S. PATENT DOCUMENTS

| 4,467,342 A | 8/1984 | Tower |
|---|---|---|
| 5,399,898 A | 3/1995 | Rostoker |

(Continued)

FOREIGN PATENT DOCUMENTS

| EP | 0 065 425 A2 | 11/1982 |
|---|---|---|
| JP | H11-135675 | 5/1999 |

(Continued)

OTHER PUBLICATIONS

International Search Report issued by the European Patent Office Search Authority for Int'l Patent Application No. PCT/US2015/030416 (Aug. 27, 2015) pp. 1-3.

(Continued)

*Primary Examiner* — Yuanda Zhang
*Assistant Examiner* — Sheikh Maruf
(74) *Attorney, Agent, or Firm* — Haynes and Boone, LLP (57) ABSTRACT

A device and method of forming the device that includes cavities formed in a substrate of a substrate device, the substrate device also including conductive vias formed in the substrate. Chip devices, wafers, and other substrate devices can be mounted to the substrate device. Encapsulation layers and materials may be formed over the substrate device in order to fill the cavities.

20 Claims, 9 Drawing Sheets

(51) Int. Cl.
*H01L 23/538* (2006.01)
*H01L 23/31* (2006.01)

(56) References Cited

U.S. PATENT DOCUMENTS

| | | | |
|---|---|---|---|
| 6,322,903 B1 | 11/2001 | Siniaguine et al. | |
| 6,448,153 B2 | 9/2002 | Siniaguine et al. | |
| 6,958,285 B2 | 10/2005 | Siniaguine | |
| 7,098,542 B1 | 8/2006 | Hoang et al. | |
| 8,237,289 B2 | 8/2012 | Urakawa | |
| 8,618,659 B2 | 12/2013 | Sato et al. | |
| 8,704,364 B2 | 4/2014 | Banijamali | |
| 8,704,384 B2 | 4/2014 | Wu et al. | |
| 9,184,104 B1* | 11/2015 | Chia | H01L 21/76898 |
| 9,402,312 B2 | 7/2016 | Shen et al. | |
| 2002/0038909 A1 | 4/2002 | Sugizaki | |
| 2004/0113283 A1 | 6/2004 | Farnworth et al. | |
| 2004/0195682 A1 | 10/2004 | Kimura | |
| 2007/0045632 A1* | 3/2007 | Oliver | H01L 23/552 257/79 |
| 2008/0054444 A1* | 3/2008 | Tuttle | H01L 21/76898 257/698 |
| 2009/0072357 A1 | 3/2009 | Tang et al. | |
| 2009/0102002 A1* | 4/2009 | Chia | H01L 27/14618 257/433 |
| 2009/0267238 A1 | 10/2009 | Joseph et al. | |
| 2011/0241222 A1* | 10/2011 | Sezi | H01L 21/561 257/782 |
| 2012/0001325 A1* | 1/2012 | Lin | H01L 21/568 257/737 |
| 2012/0020027 A1 | 1/2012 | Dungan et al. | |
| 2012/0168916 A1 | 7/2012 | Chi et al. | |
| 2012/0228778 A1 | 9/2012 | Kosenko et al. | |
| 2013/0037962 A1* | 2/2013 | Xue | H01L 21/561 257/774 |
| 2013/0069239 A1* | 3/2013 | Kim | H01L 23/49827 257/774 |
| 2013/0078767 A1 | 3/2013 | Yim | |
| 2013/0161836 A1 | 6/2013 | Yeom et al. | |
| 2013/0200511 A1 | 8/2013 | Banijamali | |
| 2013/0214432 A1 | 8/2013 | Wu et al. | |
| 2013/0307143 A1 | 11/2013 | Lin et al. | |
| 2014/0021634 A1* | 1/2014 | Nikitin | H01L 23/13 257/774 |
| 2014/0042643 A1 | 2/2014 | Yu et al. | |
| 2014/0070380 A1 | 3/2014 | Chiu et al. | |
| 2014/0084415 A1 | 3/2014 | Lin et al. | |
| 2014/0124957 A1 | 5/2014 | Iwase et al. | |
| 2014/0183761 A1* | 7/2014 | Lin | H01L 24/11 257/787 |
| 2014/0353815 A1 | 12/2014 | England et al. | |
| 2015/0021754 A1* | 1/2015 | Lin | H01L 23/5389 257/712 |
| 2015/0041980 A1* | 2/2015 | Ahn | H01L 24/94 257/738 |
| 2015/0123240 A1* | 5/2015 | Bowman | H01L 29/0688 257/506 |
| 2015/0162257 A1* | 6/2015 | Xue | H01L 23/3114 257/621 |
| 2015/0303170 A1 | 10/2015 | Kim et al. | |
| 2015/0327367 A1 | 11/2015 | Shen et al. | |

FOREIGN PATENT DOCUMENTS

| | | |
|---|---|---|
| WO | 02/34019 A1 | 4/2002 |
| WO | 2013/119309 A1 | 8/2013 |

OTHER PUBLICATIONS

Written Opinion of the International Searching Authority by the European Patent Office for Int'l Patent Application No. PCT/US2015/030416 (Aug. 27, 2015) pp. 1-8.

European Patent Office, Patent Abstracts of Japan for H11-135675, 1999 (1 page).

U.S. Appl. No. 14/214,365 titled, "Integrated Circuits Protected by Substrates wilth Cavities, and Methods of Manufacture," filed Mar. 14, 2014, 40 pages.

International Search Report Issued by the International Searching Authority for PCT application PCT/US2016/037430, dated Mar. 13, 2017. 6 Pages.

Written Opinion Issued by the International Searching Authority for PCT application PCT/US2016/037430, dated Mar. 13, 2017. 9 Pages.

* cited by examiner

STRUCTURES AND METHODS FOR RELIABLE PACKAGES

TECHNICAL FIELD

Embodiments of the present invention relate to structures of reliable packages.

DISCUSSION OF RELATED ART

Thin wafer handling in 2.5D and 3D technologies adds cost and complexity in assembly. In particular, wafer bow and cracking of thin wafers, including the interposer, can cause great difficulty during assembly. Current Chip-on-Wafer-on-Substrate (CoWoS) technologies also face challenges with wafer bow and interposer cracking during fabrication. Furthermore, thermal issues in 2.5D and 3D technologies may also lead to warpage and cracking of the components.

Therefore, there is a need for better management of the assembly of packages.

SUMMARY

In accordance with aspects of the present invention a method of forming a plurality of packages includes etching one or more cavities in a first side of a substrate device, the substrate device including conductive vias formed in a substrate; mounting chip devices to the first side of the substrate device to electrically contact the conductive vias; depositing an encapsulation layer over the chip devices and filling the crack arrest cavities; planarizing a second side to reveal the conductive vias on the second side; and singulating through the cavities to form said packages separated from each other, with each package having one or more of said chip devices mounted on a respective singulated substrate device.

In some embodiments, a method of forming a plurality of packages includes mounting a wafer to a first side of a first substrate device to electrically contact with first conducting vias formed in the substrate device; planarizing a second side of the first substrate device to reveal the first conducting vias on the second side; etching one or more cavities in the second side of the first substrate device; depositing an encapsulation layer on the second side of the first substrate device; and singulating through the cavities to form said packages separated from each other, with each package having one or more chip devices mounted on a respective singulated substrate device.

In some embodiments, a device can include a substrate device with conductive vias formed in a substrate, the conductive vias being exposed on a second side of the substrate; cavities formed in the substrate device; chip devices mounted to a first side of the substrate device in electrical contact with the conductive vias; and an encapsulation layer covering the chip devices and filling the cavities.

In some embodiments, a device can include a substrate device with conductive vias formed in a substrate, the conductive vias being exposed on a second side of the substrate; a wafer mounted on a first side; cavities formed in the substrate device; and an encapsulation layer covering the second side and filling the cavities.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various mechanical, compositional, structural, and operational changes may be made without departing from the spirit and scope of this description and the claims. In some instances, well-known structures and techniques have not been shown or described in detail in order not to obscure the invention.

Additionally, the drawings are not to scale. Relative sizes of components are for illustrative purposes only and do not reflect the actual sizes that may occur in any actual embodiment of the invention. Like numbers in two or more figures represent the same or similar elements. Further, descriptive elements such as "above" or "below" are relative to the other elements of the drawing on the drawing page and are not meant to denote absolute directionality. For example, a film described as being above a substrate may, when the substrate is turned over, actually be below the substrate. Therefore, terms such as "above" and 'below" should not be interpreted as limiting but as providing only relative positioning.

Assembly according to some embodiments of the present invention can lead to encapsulation and isolation of devices throughout the assembly. In such cases, there can be little or no thin wafer handling concerns and thermal management can be enhanced. In some embodiments, crack propagation within the wafer or substrate can be arrested. Further, assembly processes according to some embodiments can be highly scalable to large devices or interposer structures.

Figure 1:
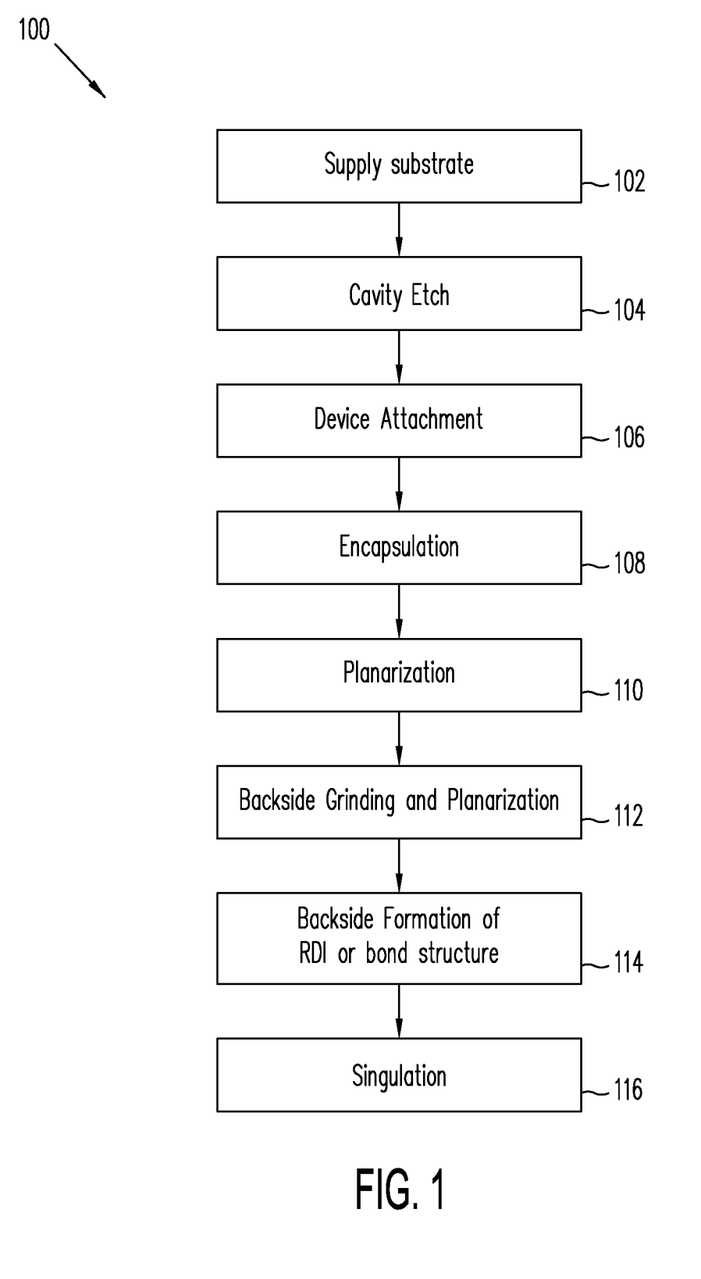
FIG. 1 illustrates a process of assembly according to some embodiments of the present invention.
Figure 2A:
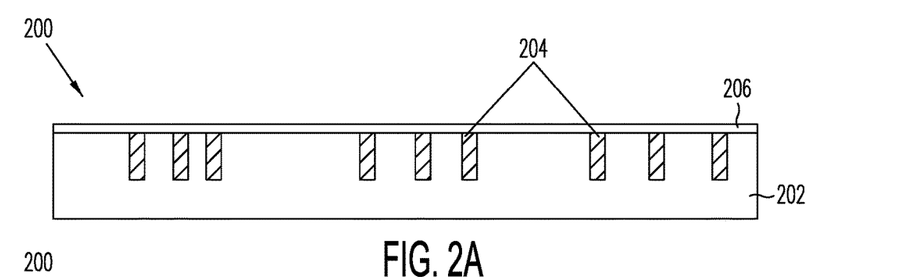
FIGS. 2A through 2M illustrate further the process of assembly illustrated in FIG. 1.

FIG. 1 illustrates a process 100 for providing a package. As shown in FIG. 1, a substrate device is supplied in step 102. As shown in FIG. 2A, substrate device 200 includes a substrate 202 with through-vias 204 formed in substrate 202. A redistribution layer (RDL) or back end-of-line layer (BEOL) 206 can be formed over substrate 202 and can be in contact with vias 204. In some embodiments, substrate 202 can be silicon or glass. Vias 204 can be through-silicon-vias (TSV)s formed with metallization materials.

Figure 2B:
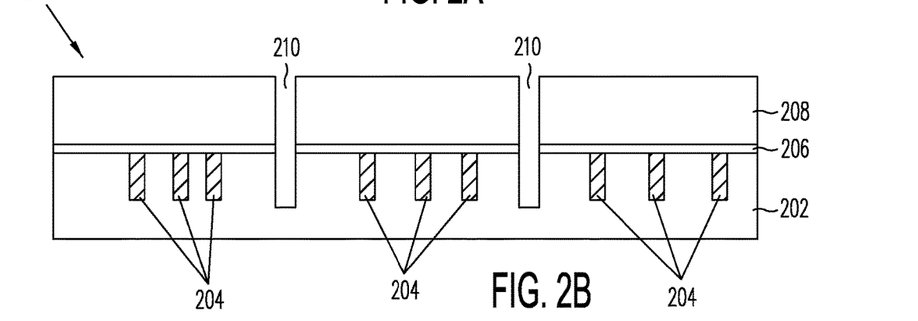

As shown in FIG. 1, a cavity etch step 104 is performed on device substrate 200. As illustrated in FIG. 2B, an etch mask 208 is formed over layer 206 and device substrate 200 is etched through mask 208 to form crack arrests 210. In some embodiments, as shown in FIG. 2B, crack arrests 210 are formed at least as deep into substrate 202 as are vias 204. In some embodiments, crack arrests 210 are etched as deeply as are vias 204. Mask 208 can then be removed from over layer 206.

Figure 2C:
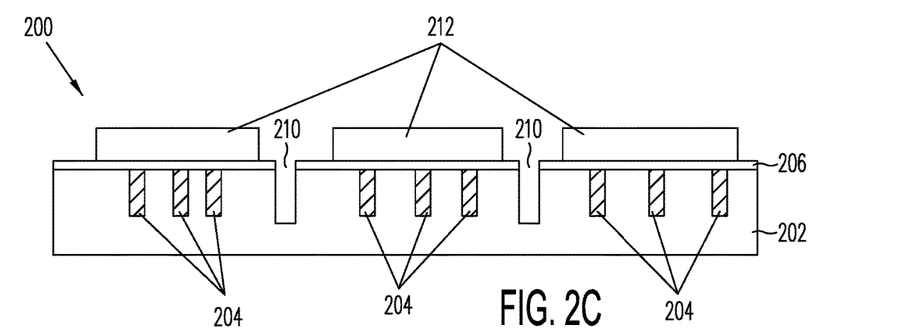
Figure 2D:
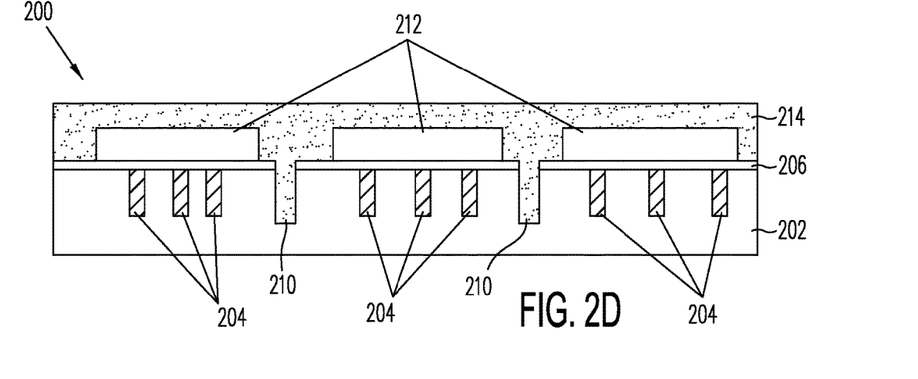
Figure 2E:
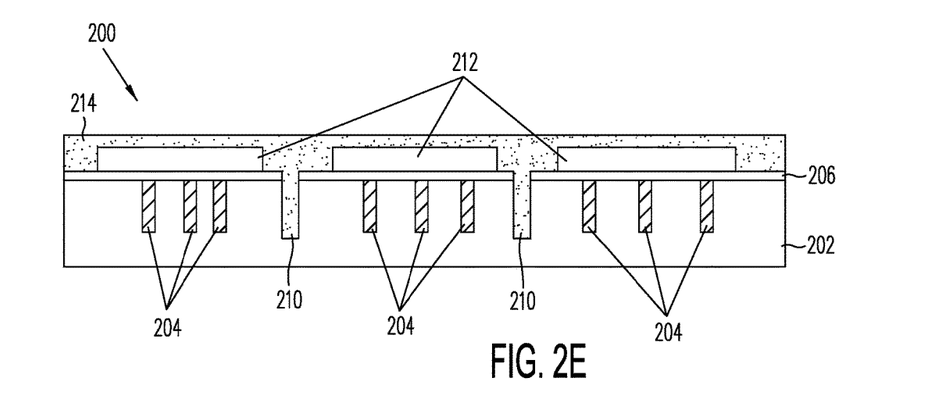

In step 106 of process 100, as illustrated in FIG. 2C, a chip device 212 is mounted over layer 206. Layer 206 provides for interconnects between chip device 212 and vias 204. In step 108, as illustrated in FIG. 2D, an encapsulation layer 214 is deposed over chip device 212 and layer 206 such that crack arrests 210 are filled and chip devices 212 are encapsulated between encapsulation layer 214 and layer 206. In step 110 of process 100, as illustrated in FIG. 2E, encapsulation layer 214 can be planarized so that its thickness is reduced. Encapsulation layer 214, however, still encapsulates chip devices 212. Encapsulation material for layer 214 can be a low coefficient of thermal expansion (CTE) dielectric material. In some embodiments, crack arrests 210 can be coated with a thin insulating layer such as TaN or TiN and encapsulation material for layer 214 can be a hard material such as aluminum oxide or other such material.

Figure 2F:
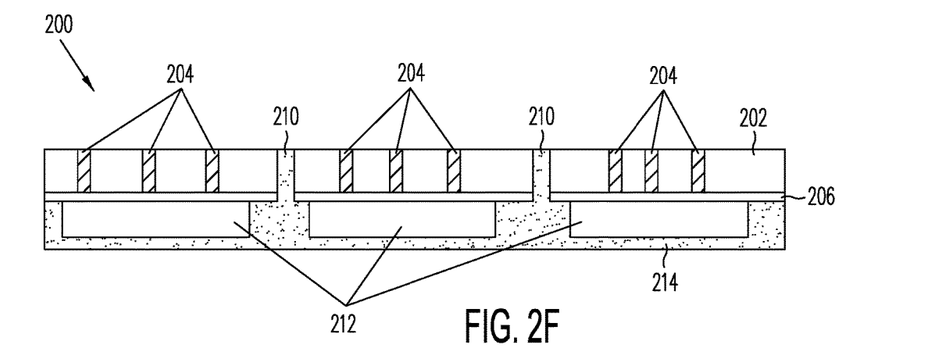

In step 112 of process 100, as illustrated in FIG. 2F, substrate 202 (the backside of substrate device 200) is ground and planarized to expose vias 204. In some embodiments, as is shown in FIG. 2F, crack arrests 210 filled with encapsulation material of layer 214 are also exposed to form isolation bridges. Embodiments where crack arrests 210 are not exposed in step 112 are discussed starting with FIG. 2J below.

Figure 2G:
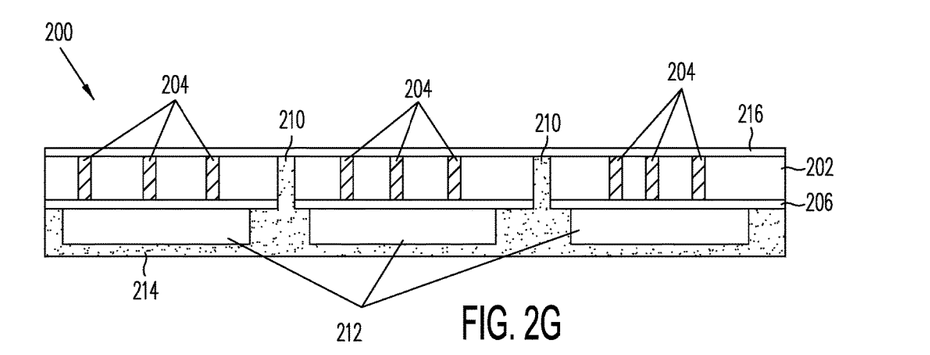

In step 114, as illustrated in FIG. 2G, an RDL layer 216 can be formed in contact with vias 204.

Figure 2H:
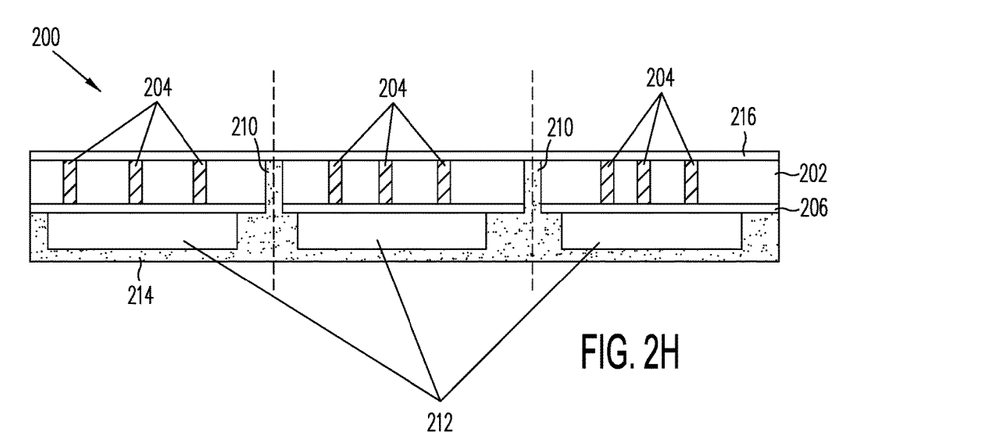
Figure 2I:
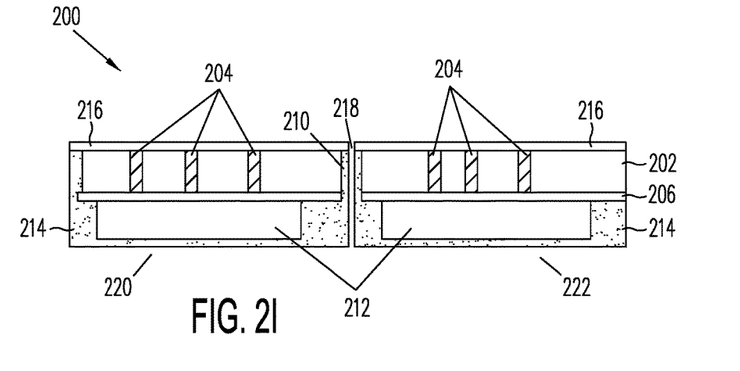
Figure 2J:
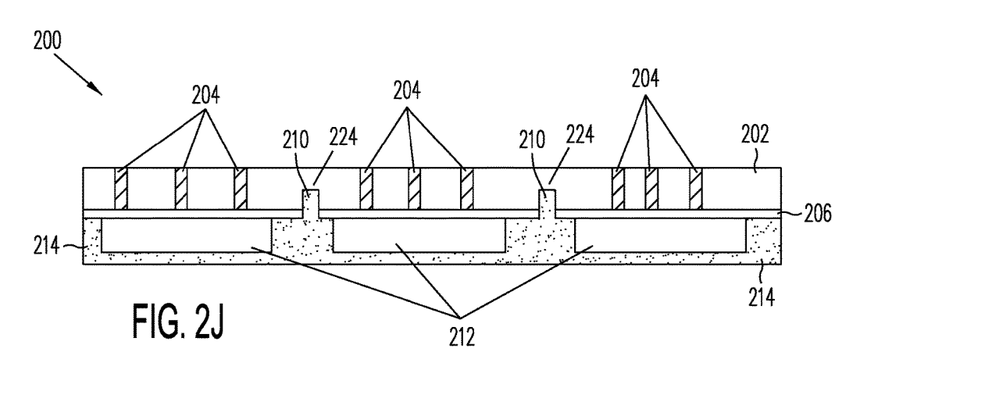

As shown in step 116 and illustrated in FIG. 2H, a singulation process is performed to split substrate device 200 along crack arrests 210. As such, as is shown in FIG. 2I, two devices 220 and 222 are separated by cut 218 through crack arrests 210. Returning to step 112 of process 100, in some embodiments crack arrests 210 are not exposed. As shown in FIG. 2J, if crack arrests 210 are not formed as deeply into substrate 202 as is vias 204, a substrate bridge 224 is formed during planarization. In such a case, crack arrests 210, filled with encapsulation material of encapsulation layer 214, are separated from the plane formed by the exposed vias 204 by a remainder of substrate material of substrate layer 202 to form the substrate bridge 224.

Figure 2K:
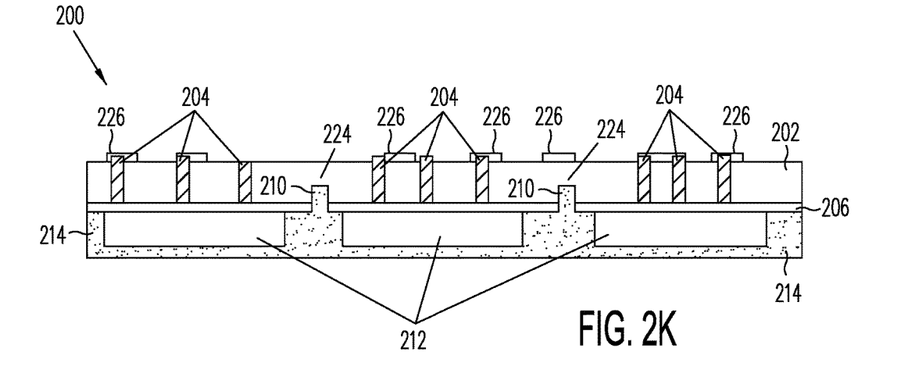
Figure 2L:
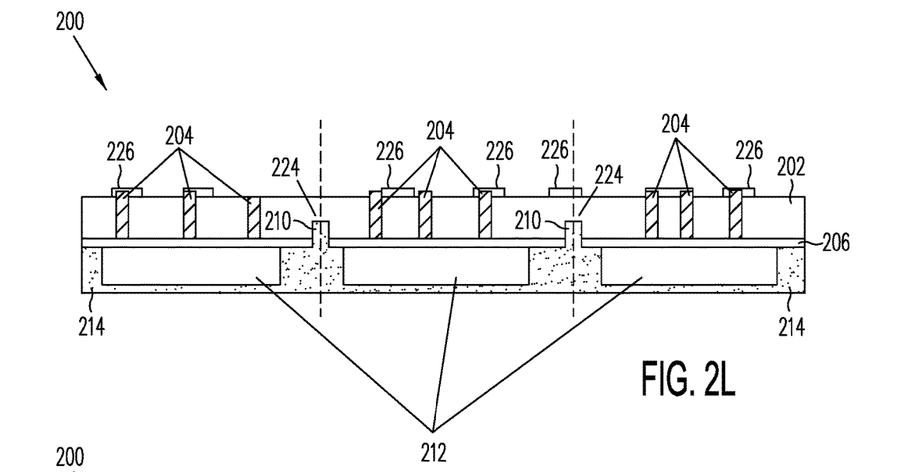
Figure 2M:
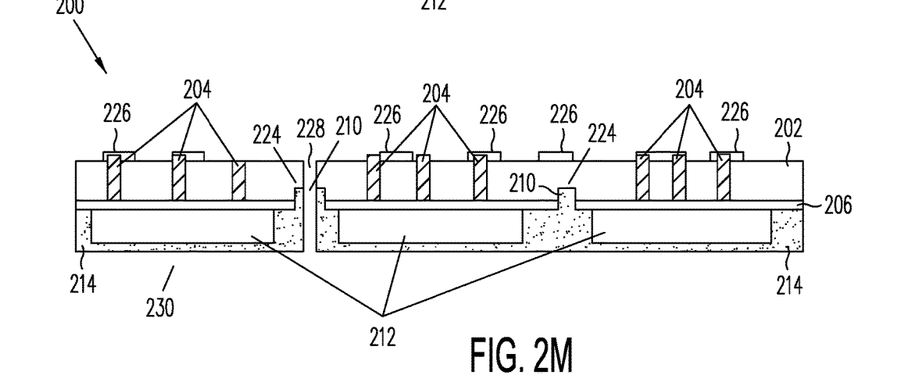

In step 114, as shown in FIG. 2K, an RDL layer or bonding layer 226 can be formed. As shown in step 116 and illustrated in FIG. 2L, a singulation process is performed to split substrate device 200 along crack arrests 210. As such, as is shown in FIG. 2M, a device 230 is formed by a cut 228 through crack arrests 210.

Forming crack arrests 210 in device substrate 200 and then encapsulating chip devices 212 with encapsulation layer 214 protects chip devices 212 and substrate device 200 from cracking and warping throughout the assembly process. Further, such processes help to thermally manage the process so that thermal effects do not add to the warpage and cracking of the components.

Figure 3:
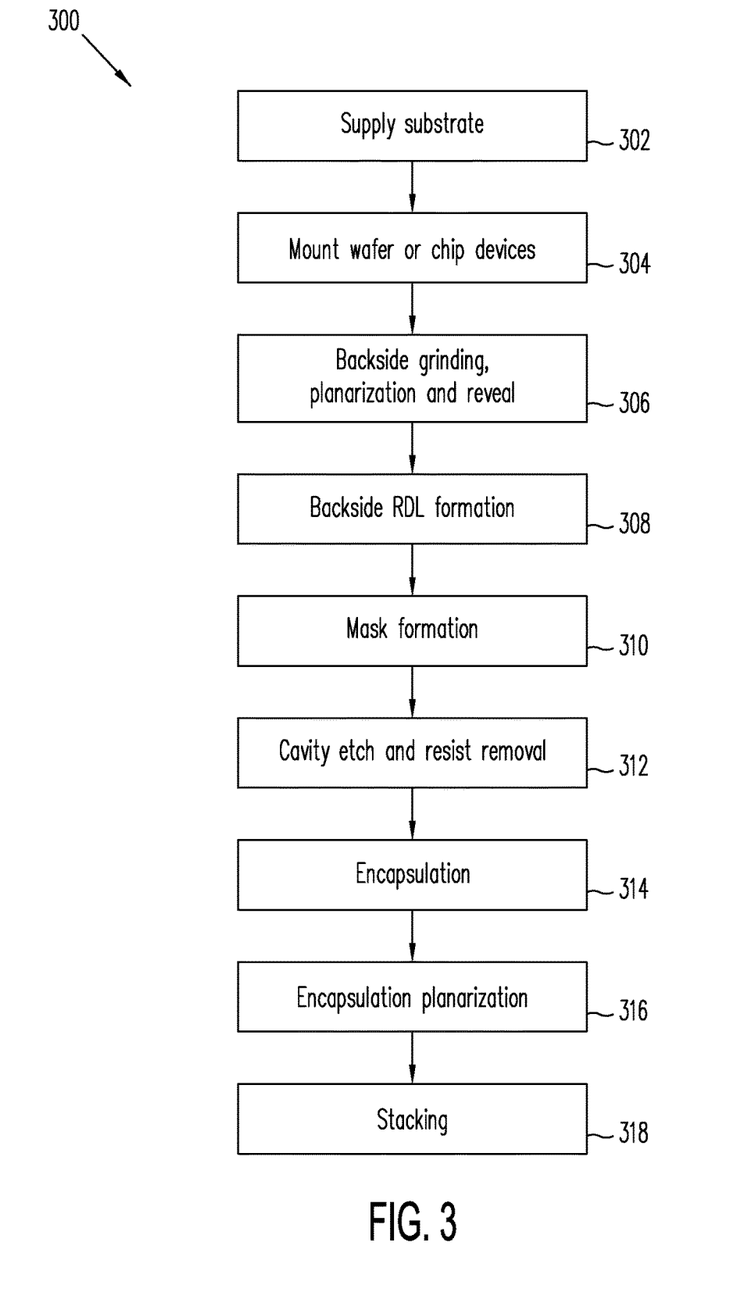
FIG. 3 illustrates a process for stacking devices according to some embodiments.
Figure 4A:
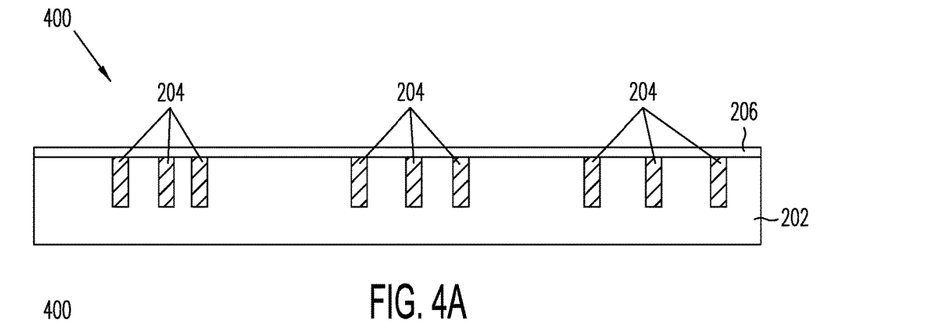
FIGS. 4A through 4I illustrate further the process of stacking illustrated in FIG. 3.

FIG. 3 illustrates a process 300 that illustrates some further aspects of embodiments of the present invention. As shown in FIG. 3, process 300 starts at step 302 with substrate device 400. As shown in FIG. 4A, substrate device 400 may be the same as substrate device 200 shown in FIG. 2A and may include a substrate 202, vias 204, and an RDL layer 206.

Figure 4B:
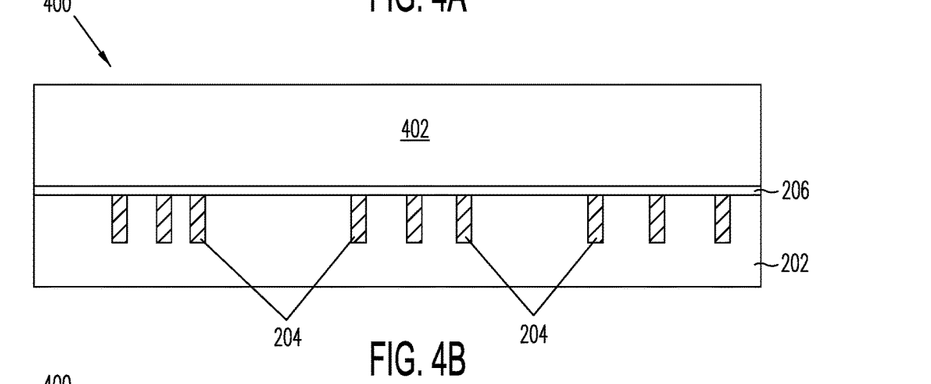

In step 304 a wafer or chip device may be mounted on RDL layer 206. FIG. 4B illustrates a wafer 402 mounted on RDL layer 206. However, one or more chip devices may be mounted as well. Wafer 402 may represent any combination of other vias and chips mounted on RDL layer 206.

Figure 4C:
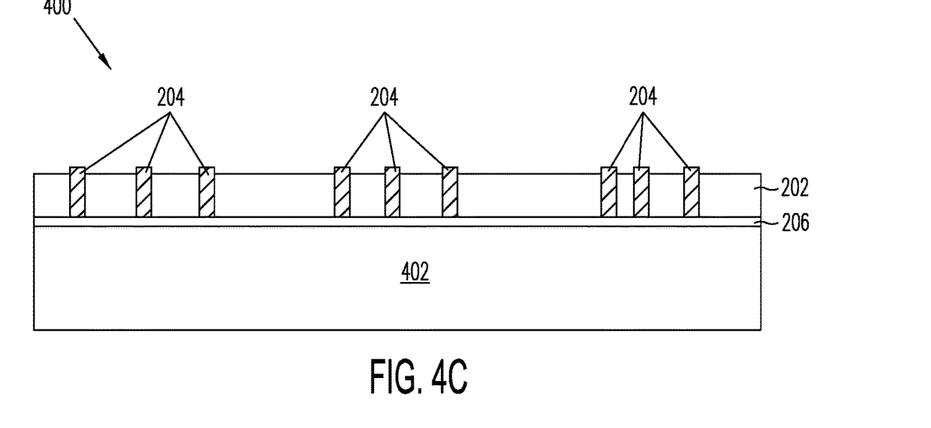
Figure 4D:
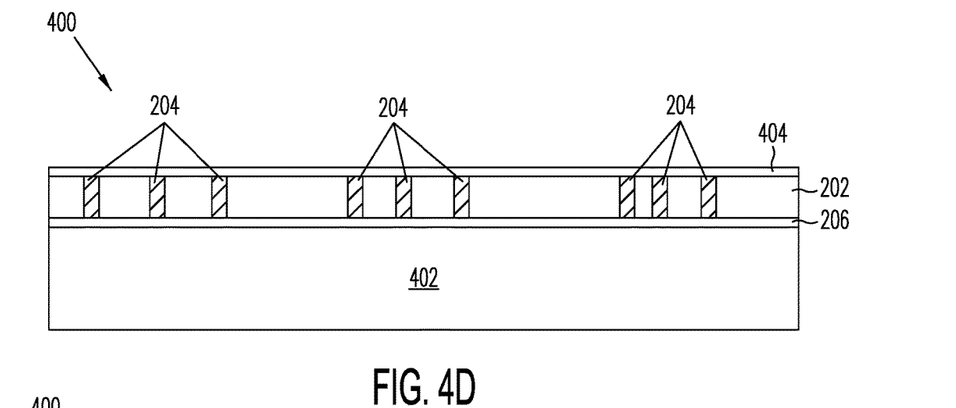

In step 306, the backside of substrate device 400 may be ground to planarize the device and reveal vias 204, as is shown in FIG. 4C. As is illustrated in FIG. 4C, substrate 202 is ground to reveal vias 204. In step 308, and as illustrated in FIG. 4D, an RDL layer 404 may be deposited in contact with the exposed vias 204. In some embodiments, RDL layer 404 may be omitted.

Figure 4E:
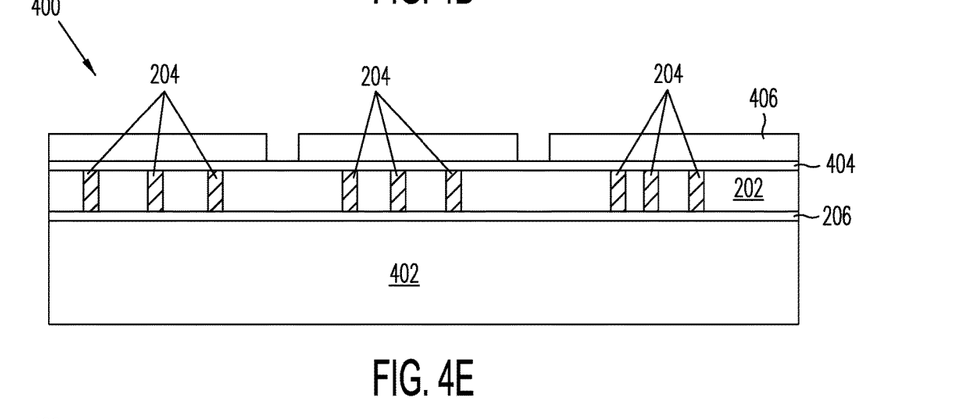
Figure 4F:
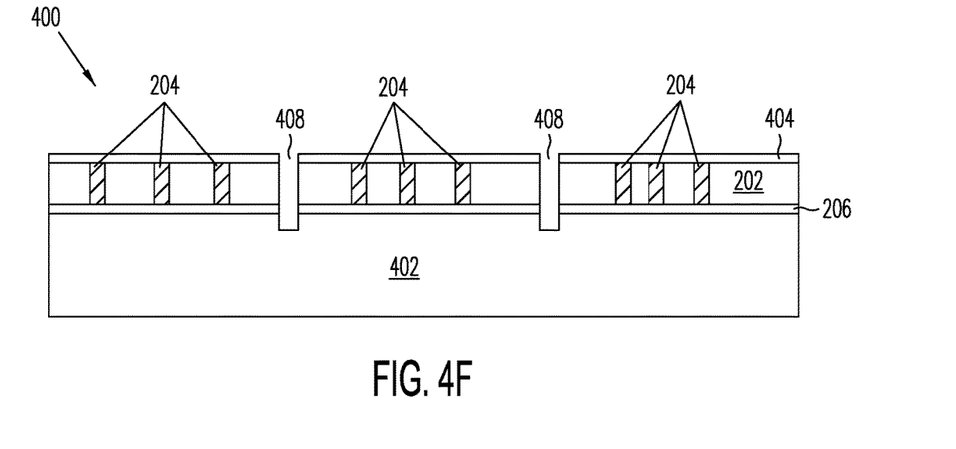

In step 310, and as shown in FIG. 4E, a mask 406 may be formed on RDL layer 404. Mask 406 may be formed by patterning a resist deposited over RDL layer 404. In step 312, and as shown in FIG. 4F, substrate device 400 is etched through mask 406 to form crack arrests 408. Mask layer 406 can then be removed. In some embodiments, chip devices (not shown) can be mounted to RDL layer 404.

Figure 4G:
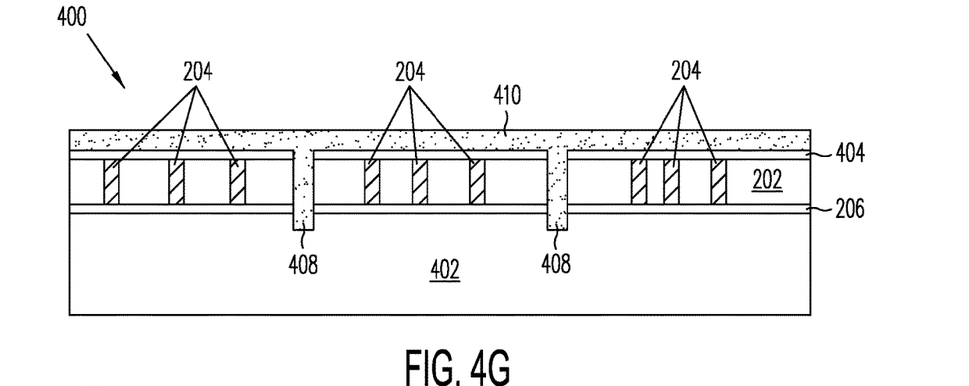

In step 314, and as shown in FIG. 4G, an encapsulation layer 410 is deposited on RDL layer 404 and filling crack arrests 408. If any chip devices are mounted on RDL layer 404, then encapsulation layer 410 can be encapsulated the mounted chip devices.

Figure 4H:
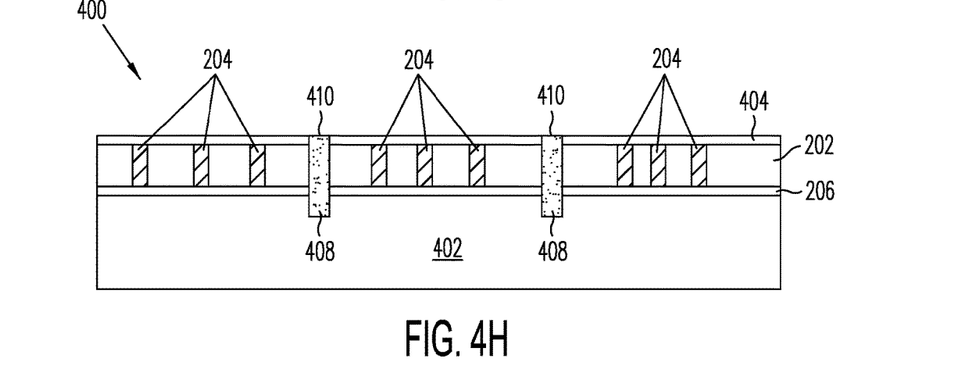
Figure 4I:
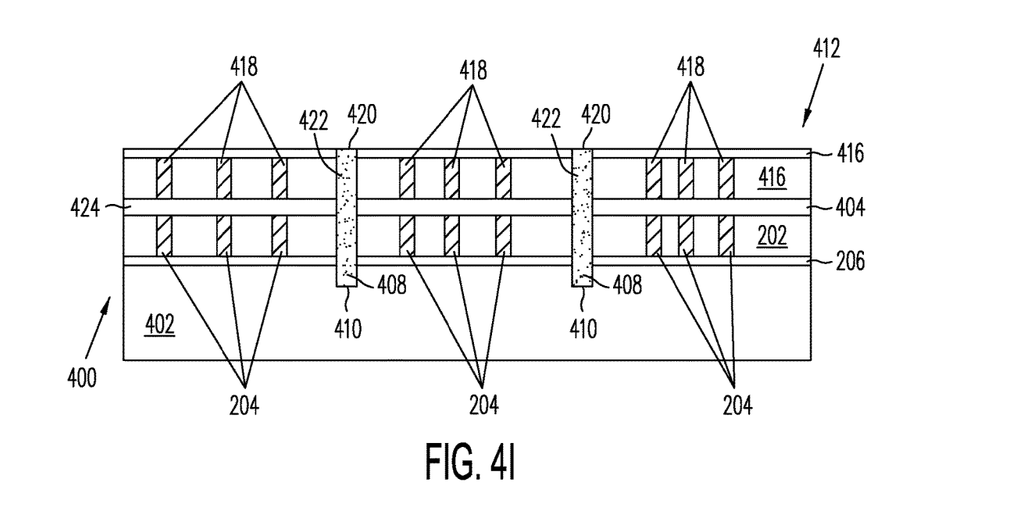

In step 316, and as illustrated in FIG. 4H, the encapsulation layer 410 can be removed to RDL layer 404, or if any chip devices are mounted on RDL layer 404 to the chip devices, or if RDL layer 404 is absent to expose vias 204. In step 318, as shown in FIG. 4I another substrate device 412 can be stacked with substrate device 400. As shown in FIG. 4I, substrate device 412 can include a substrate 404 with RDL layers 412 and 424 and with vias 418 formed between RDL layers 412 and 424. Further, crack arrests 420 filled with encapsulation material 422 are formed. Substrate device 412 is mounted to substrate device 400 such that RDL layer 424 contacts RDL layer 404. As such, substrate device 412 can be formed similarly to substrate device 400 except that wafer 402 is absent.

As shown in process 300, in some embodiments multiple layers can be stacked and backside etching can be performed. It should be noted that aspects of process 300 can be included in process 100 in order to stack multiple components. Further, the stacked combination of substrate device 412 with substrate device 400 can be separated by cutting through crack arrests 420 and crack arrest 410.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A method of forming a plurality of packages, the method comprising:
    etching one or more cavities in a first side of a substrate device, the substrate device including conductive vias formed in a substrate;
    mounting chip devices to the first side of the substrate device to electrically contact the conductive vias;
    depositing an encapsulation layer over the chip devices and filling the cavities;
    planarizing a second side to reveal the conductive vias on the second side; and
    singulating through the cavities to form said packages separated from each other, with each package having one or more of said chip devices mounted on a respective singulated substrate device.

2. The method of claim 1, wherein a redistribution layer is formed over the conductive vias on the substrate device.

3. The method of claim 2, wherein mounting chip devices includes mounting chip devices to the redistribution layer.

4. The method of claim 1, wherein the cavities are etched to a depth into the substrate that is equal to or exceeds that of the conductive vias to form an isolation bridge.

5. The method of claim 1, wherein the cavities are etched to a depth into the substrate that is less than that of the conductive vias to form a substrate bridge.

6. The method of claim 1, further including forming a redistribution layer, back end-of-line layer, or bonding layer over the conductive vias on the second side prior to singulating.

7. A method of forming a plurality of packages, the method comprising:
   mounting a wafer to a first side of a first substrate device to electrically contact with first conducting vias formed in the substrate device;
   planarizing a second side of the first substrate device to reveal the first conducting vias on the second side;
   etching one or more cavities in the second side of the first substrate device;
   depositing an encapsulation layer on the second side of the first substrate device; and
   singulating through the cavities to form said packages separated from each other, with each package having one or more chip devices mounted on a respective singulated substrate device.

8. The method of claim 7, further including forming a first redistribution layer in electrical contact with the first conducting vias on the second side of the first substrate device and wherein etching one or more cavities in the second side of the first substrate device includes etching through the first redistribution layer.

9. The method of claim 8, further including mounting devices onto the first redistribution layer.

10. The method of claim 8, further including mounting a second substrate device, the second substrate device including second conducting vias formed in the second substrate device and cavities formed in the second substrate device, wherein the cavities in the second substrate device align with cavities in the first substrate device.

11. The method of claim 10, wherein the second substrate device includes a second redistribution layer that electrically contacts the first redistribution layer.

12. The method of claim 1 wherein said mounting is performed after said etching.

13. The method of claim 12 wherein said planarizing is performed after said etching.

14. The method of claim 1 wherein said depositing is performed after said mounting.

15. The method of claim 1 wherein said planarizing is performed after said mounting.

16. The method of claim 1 wherein said planarizing is performed after said depositing.

17. The method of claim 7 wherein said depositing comprises depositing said encapsulation layer into the cavities.

18. The method of claim 7 wherein the cavities enter the wafer.

19. The method of claim 10 wherein said singulating is performed through the aligned cavities in the first and second substrate devices.

20. The method of claim 19 wherein before said singulating, the cavities in the second substrate device contain encapsulation material.

* * * * *